US006980353B2

(12) United States Patent
Watson et al.

(10) Patent No.: US 6,980,353 B2
(45) Date of Patent: Dec. 27, 2005

(54) FREQUENCY SYNTHESISER

(75) Inventors: Christopher D Watson, Kanata (CA); Alwyn J Seeds, London (GB)

(73) Assignee: QinetiQ Limited, Farnborough (GB)

( * ) Notice: Subject to any disclaimer, the term of this patent is extended or adjusted under 35 U.S.C. 154(b) by 127 days.

(21) Appl. No.: 10/399,654

(22) PCT Filed: Oct. 15, 2001

(86) PCT No.: PCT/GB01/04570

§ 371 (c)(1),
(2), (4) Date: May 29, 2003

(87) PCT Pub. No.: WO02/33818

PCT Pub. Date: Apr. 25, 2002

(65) Prior Publication Data

US 2004/0051936 A1    Mar. 18, 2004

(51) Int. Cl.[7] .............................. G02F 2/02; H01S 3/10
(52) U.S. Cl. ........................................ 359/326; 372/28
(58) Field of Search ............ 359/326–332; 372/20–22, 372/28, 32

(56) References Cited

U.S. PATENT DOCUMENTS

| 5,335,106 | A | * | 8/1994 | Paquin et al. ............... 398/201 |
| 5,379,309 | A | | 1/1995 | Logan, Jr. ..................... 372/18 |
| 5,493,110 | A | * | 2/1996 | Takeuchi et al. ............ 250/205 |
| 5,777,778 | A | | 7/1998 | Yao .............................. 359/245 |
| 6,560,452 | B1 | * | 5/2003 | Shealy ........................ 455/333 |
| 2002/0159130 | A1 | * | 10/2002 | Sakano et al. ............... 359/326 |

FOREIGN PATENT DOCUMENTS

GB            2185619 A        7/1987

OTHER PUBLICATIONS

Gough et al; "Exact Millimeter Wave Frequency Synthesis by Injection Locked Laser Comb Line Selection"; International Topical Meeting on Microwave Photonics; MWP; Technical Digest; 1999, vol. 1; pp. 61-64.

Shimizu et al; "Continuous-Wave Laser Frequency Synthesizer With a 100 $GH_z$ Tuning Range and a High Absolute Frequency Stability"; Proceedings of the European Conference on Optical Communication (ECOC) Montreux, Sep. 12-16, 1993; Zurich, sev, ch, vol. 3, Conf. 19, Sep. 12, 1993, pp. 93-96, XP000492296.

Langley et al; "Packaged Semiconductor Laser Optical Phase-Locked Loop (OPLL) for Photonic Generation, Processing and Transmission of Microwave Signals"; IEEE Transactions on Microwave Theory and Techniques, vol. 47, No. 7, Jul. 1999, XP000846031, pp. 1257-1264.

* cited by examiner

*Primary Examiner*—John D. Lee
(74) *Attorney, Agent, or Firm*—Nixon & Vanderhye P.C.

(57) ABSTRACT

A frequency synthesiser for generating wideband signals for zero Hz up to frequencies in the millimetre wave band provides the ability for arbitrarily fine increments in output frequency. The synthesiser has an optical comb generator that provides a set of reference signals at predetermined intervals. These reference signals are fed to two or more laser devices, at least one of which is a frequency selection and translation device capable of selecting a particular output line from the comb generator and shifting it by some desired frequency. The outputs from the laser devices are then combined and detected using a photodetector. The output from this is the system output. Various methods of producing the frequency selection and translation device are disclosed, as are various methods of producing the optical comb reference signal. Some possible applications of the invention are also disclosed.

23 Claims, 4 Drawing Sheets

FREQUENCY SYNTHESISER

This application is the US national phase of international application PCT/GB01/04570 filed 15 Oct. 2001, which designated the US.

This invention relates to a synthesiser for generating frequencies in the range from near zero Hertz to the millimetre and sub-millimetre wavebands. More specifically, it relates to a synthesiser that produces an output frequency by means of detecting laser signals using a photodetector, and is capable of arbitrarily small frequency increments between the minimum and maximum output frequency.

BACKGROUND

There are many applications for frequency synthesisers that are capable of operating over a very wide frequency range. Instrumentation, millimetre wave and sub-millimetre wave, radar, communications systems, imaging systems, spectroscopy applications and general laboratory test equipment have requirements in this field. Existing ultra-wideband generators of frequencies in the range covered by the present invention all work by switching over from one type of frequency generator to another as the output frequency required goes out of the range of a particular generator type.

There is one type of synthesiser that works by combining two or more laser sources and presenting this combined signal to a photodetector. The photodetector output will comprise, amongst other components, $f_{L1}-f_{L2}$, where $f_{L1}$ and $f_{L2}$ are the respective frequencies of the two the laser sources. By a suitable choice of $f_1$ and $f_2$, any frequency can be produced that is within the bandwidth of the photodetector. There are problems with this technique. The linewidth of a typical laser can be several megahertz (MHz) wide, and combining two uncorrelated laser sources in a photodiode will produce an output signal that is too noisy for most practical purposes. Techniques exist[1,2] for ameliorating this by locking the two laser sources to a common reference signal such as, for example, another laser source so that much of the noise is correlated and so does not appear in the wanted output. Injection locked lasers would commonly be used as the laser sources as these are easily locked to a reference laser source.

These techniques can be used to provide an output frequency of low noise, but they suffer the disadvantage that the system output frequency is relatively inflexible, in that it can only be adjusted in increments of approximately a few hundred MHz minimum. For instance, if a laser with multiple frequency outputs is used as the reference source, then each of the injection locked lasers can be locked to a different output, but when the signals are combined in the photodetector, the output frequency step is limited to the difference between two successive outputs from the reference laser. If the number of frequency outputs per unit bandwidth from the reference is increased, so as to reduce the minimum step size, then it will be harder to keep each of the laser sources locked to one specific frequency line. Drift in the injection locked lasers will cause them to lock on to adjacent spectral lines if the lines are too close to each other.

The present invention overcomes these limitations, and also provides for very quick changes between desired frequencies.

STATEMENT OF INVENTION, AND ADVANTAGES

According to the present invention there is provided a radio frequency synthesiser comprising at least one optical frequency selection and translation device providing a first optical output and taking an input from an optical reference oscillator system capable of providing at least two different optical frequency outputs, where the first output from the selection and translation device is combined with a second optical output signal derived from the optical reference oscillator system and detected.

The use of a frequency translating device—a device that is capable of providing an output frequency different from that of any of the components of the optical reference system—along with a frequency selection mechanism provides for a much greater freedom in choosing the system output frequency. There are several different types of frequency translating device that can be used. Current methods include, but are not limited to, heterodyne optical phase lock loops, acousto-optical frequency shifters, electro-optical frequency shifters, and heterodyne optical injection phase lock loops. These frequency translating devices are able to take the input signals from the optical reference oscillator system operating at a particular spectral line frequency spacing, select a desired spectral line, and produce an output signal that differs from the selected spectral line by an amount according to the frequency of a reference that is input to the translating device. Some of these devices take the optical input signal and move it in frequency, whilst others use the optical input signal as a basis for the generation of a new optical signal. Thus some frequency translating devices act as tuneable sources, whilst others act purely as frequency shifters. The latter type will need the addition of a tuneable optical filter if there is no filtering action inherent in its operation, to remove unwanted inputs from the reference oscillator system. Both types of frequency translating device are suitable for use with the current invention. It will be understood that the invention is not limited to the use of the frequency translating devices specified above, but that any device capable of taking an optical signal as input and providing an optical signal as output that differs in frequency from the input by a controlled amount may be suitable for implementing the invention.

Note that in this specification, optical signals can be taken as being those signals that can be generated using laser techniques. These will be of the order 10 THz (corresponding to a wavelength of $30\mu$) or above. Signals that are capable of being output from a photodetector can be taken as being RF signals. Current technology allows signals of the order 150 GHz to be detected, but the invention will work with photodetectors that have a higher upper frequency limit.

Advantageously, the second output signal is also derived from a frequency selecting and translating device, so that selection of an arbitrary output frequency from the invention is more convenient, as described below.

The optical reference oscillator system will preferably be an optical frequency comb (OFC) generator, which is capable of generating several spectral lines at known frequency intervals. However, it may also comprise a system of two or more lasers locked to a common source frequency, with each laser providing different output frequencies. In general, it can be any system that has two or more optical output signals of different frequencies that are capable of providing a reference to the frequency selection mechanisms.

There are various types of OFC generator, some of which will be more suited to the current invention than others. Preferably, the spacing between adjacent comb lines will be stable in frequency, yet adjustable to a desired frequency. Preferably, the amplitudes of all spectral lines to be used are similar. Preferably, all comb lines will have high phase correlation. Preferably, the minimum comb spacing will be of the order 1 GHz to 10 GHz, to prevent the frequency translators from hopping from one spectral line to another.

Some possibilities are as follows:

Mode-Locked Laser[2]:

This method employs a multi line laser who's modes are locked together by a periodic perturbation of the laser cavity.

Optical Parametric Oscillator Frequency Divider OFC Generator[3]:

This method employs a single laser to pump a set of optical parametric oscillators, whose evenly spaced outputs form the major frequency markers of the comb.

External Resonant Cavity Electro-Optic OFC Generator[4]:

This method relies on the production of a comb of equally spaced modes from a single carrier frequency. An electro-optic modulator is used to superimpose a microwave frequency onto the optical carrier frequency. This produces a comb of modes with a spacing of exactly the microwave frequency.

Fibre Methods[5]

There are several techniques that employ simplified optical fibre loops for OCF generation. One of them, proposed by Ho and Kahn[6] uses an electrooptic phase modulator fibre loop structure. The basic concept here is to place a phase modulator within a recirculating loop, so that the phase modulation is enhanced by multiple passes of light through the modulator. The loop also includes an optical amplifier to compensate for the round trip loss.

Other techniques exist for OFC generation that may be suitable for use in the current invention.

The detector will preferably be a photodiode. If a plurality of input frequencies are fed into a photodiode, then the square law nature of the photo-detection process will result in the generation of difference frequency terms. Given two optical inputs, a and b, where a=A sin $\omega_1 t$, and b=B sin $\omega_2 t$, then the detection process will result in a frequency component at $|\omega_1 - \omega_2|$. This is the desired output from the frequency synthesiser system. Other, unwanted, frequency components will also be produced, but these will tend to be much smaller than those of the wanted term.

According to the present invention there is also provided a method of synthesising a signal comprising the steps of:

providing a reference system having an output that has a plurality of spectral lines within the frequency band used by a laser;

presenting this output to a frequency selection and translation device having an output that comprises a single spectral line chosen from those at its input that has been translated in the frequency domain by an amount determined by a reference frequency input.

presenting the output of the reference system to a frequency selection device that is capable of selecting a single spectral line;

taking the output from the frequency selection and translation device, and the output from the frequency selection device, and combining and downconverting the two outputs to produce a radio frequency signal.

Preferably, the reference system in the method described above is capable of varying the spacing between adjacent spectral lines according to a radio frequency reference that is placed on an input to the reference system.

Preferably, the frequency selection device in the method described above can also incorporate frequency translation means. This gives greater versatility in choosing the output frequency.

The present invention can be used to generate sinusoidal waveforms. It can also be used to generate more complex waveforms comprising of a plurality of sinusoidal components in the RF output. Modulated RF waveforms can also be generated in a straightforward fashion. An optical modulator can be added in the optical path to provide modulation at optical frequencies, or the frequency translator itself could be used to modulate its optical output. Preferably, the modulation would be performed within the frequency translator. More than one of the optical signals that are later combined could be modulated, to produce a complex modulated signal.

DETAILED DESCRIPTION OF THE INVENTION

The prior art, as described above, combines the outputs from two injection locked lasers, each locked to a different spectral line from the reference system, in the photodiode to produce the RF output frequency. To adjust the frequency in such a device, one or both of the lasers must be locked to a different spectral line from the reference system. The minimum frequency step, $f_1$, at the output of such a system is limited to the separation of the spectral lines in the reference system, coupled with the finite ability for the injection locked lasers to select closely spaced spectral lines. In practice, this limit is of the order 1 GHz.

The current invention improves on this method. If the reference system were able to modify its spectral line spacing, by, for example, changing the frequency of a clock reference $f_c$ to $f_c + \Delta f_c$ then it becomes possible, by changing both the particular spectral line chosen and the frequency $\Delta f_c$, to get certain arbitrarily fine increments. The disadvantage is that the fine increments cannot be achieved uniformly across the whole bandwidth—they are dependent on the chosen output frequency and the number of spectral line spacings, n, between the chosen spectral lines.

If, in this system, one of the injection locked lasers was replaced by a frequency selecting and translating device, such that it took in as its input a particular spectral line, and produced as its output a signal comprising that spectral line moved in frequency by a variable translation frequency $f_1$, then arbitrarily fine frequency increments are possible across the full system bandwidth. The output of this system will be $F = nf_c \pm f_1$. If $f_1$ is then incremented in steps $\Delta f_1$, then F is incremented in steps $\Delta f_1$, irrespective of n and F.

For added convenience in operation, the second injection locked laser can also be replaced by a frequency translating device, such that it takes in as its input a particular spectral line, and produces as its output a signal comprising that spectral line moved in frequency by a translation frequency $f_2$. The output of such a system will be $F = nf_c \pm f_1 \pm f_2$. If $f_2$ is incremented in steps $\Delta f_2$ then F is incremented in steps $\Delta f_2$ irrespective of n and F. Furthermore, by making $\Delta f_2$ a sub-multiple of $\Delta f_1$ interpolation between frequency increments $\Delta f_1$ is possible over the entire output frequency range.

The circuitry to produce reference signals $f_c$, $f_1$, $f_2$ is relatively straightforward, and many techniques are commonplace in the prior art.

One system that is particularly suitable for use as a frequency translating and selecting device is the heterodyne optical injection phase lock loop (OIPLL).

Another system that is suitable for use as a frequency translating and selecting device is the optical phase lock loop (OPLL).

Another system that is suitable for use as a frequency translating and selecting device is the filtered acousto-optic or electro-optic translator.

Another system that is suitable for use as a frequency translating and selecting device is the optical modulator. This can be an amplitude or phase modulator, can be single or double sideband, and can use electro-optic, acousto-optic or other physical principles to affect the input from the OFC. For single sideband modulators a tuneable optical filter to select the required spectral line from the OFC can be placed at the input of the modulator. For other modulators a tuneable optical filter must be placed at the output of the modulator to remove unwanted outputs. Since these will be spaced from the wanted output by the translation frequency special care must be given to filter selectivity to ensure adequate suppression of the unwanted output. Advantageously, a tuneable filter can be placed at the input for all modulator types to improve the spurious rejection of the translator. The optical modulator is also particularly suitable for modulating the optical signal with some desired modulation signal. This would typically be a low frequency or baseband signal carrying some information content, but some applications may require high frequency signals to be used as modulating waveforms.

Details on these devices are given below, and also in the appropriate references.

The combination of the optical signals from the frequency translation devices can be carried out either in the photodetector itself, or in a separate combiner and the combined optical signal carried to the photodiode by any convenient means. It is important that the polarisation of the signals from the translation devices is matched before, or as they are combined. Specifically, the E-fields of the signals should be substantially in alignment as they add vectorially. Misalignment will lead to a less efficient coupling, and the magnitude of the sum optical signal will be reduced, leading to degradation in the signal to noise performance of the system.

DRAWINGS

Some examples of specific embodiments of the current invention will now be described, by way of example only, with reference to the accompanying illustrative drawings, in which.

DETAILED DESCRIPTION OF THE DRAWINGS

Figure 1:
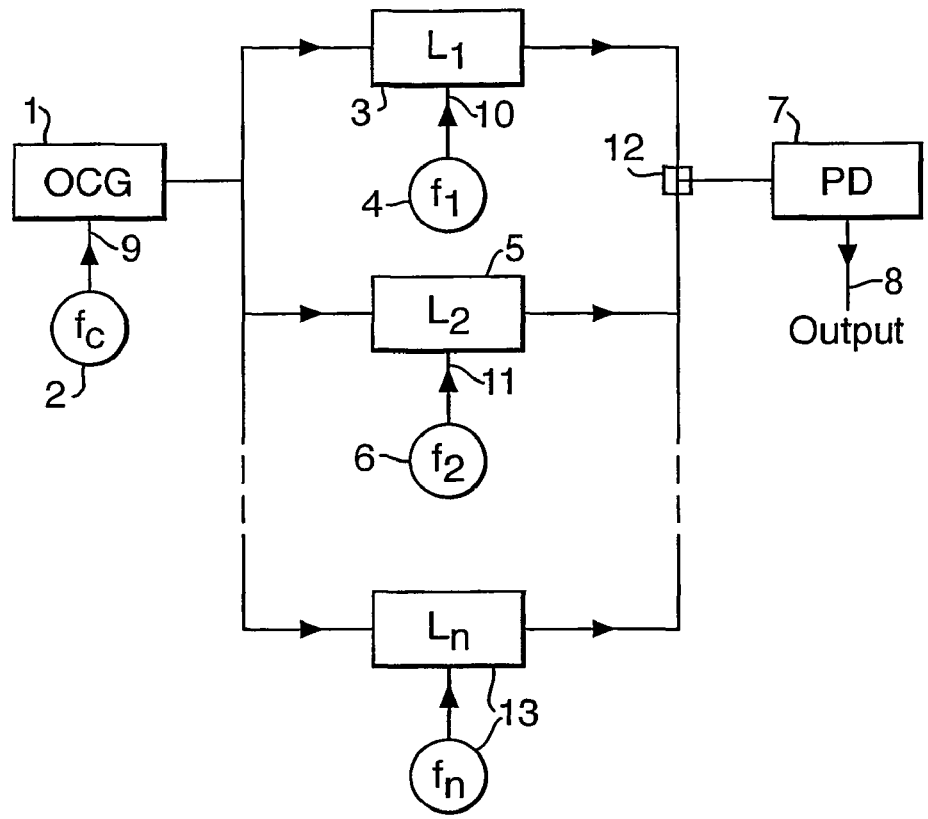
FIG. 1 shows, in block diagrammatic form, the basic layout of the major components in one form of the invention.

With reference to FIG. 1, an optical comb generator, OCG, 1, taking the role of the optical reference oscillator system, and having a frequency lock input 9, provides a signal output comprising spectral lines spaced in frequency by the signal frequency placed on the frequency lock input 9. The RF frequency reference 2 provides a signal, $f_c$, into the frequency lock input 9, and hence provides for spectral lines spaced at $f_c$ on the output of the OCG.

Frequency selection and translation devices 3, 5 are each locked to one of the spectral lines of the OCG, the choice of line depending on the desired output frequency. Both frequency selection and translation devices 3, 5 have their own respective RF frequency references, 4, 6.

While the frequency selection and translation devices can be operated separately to synthesise optical frequencies locked to the OFC, RF synthesis is achieved by combining the outputs of either two or more frequency translation and selection devices as illustrated in FIG. 1, or one frequency translation and selection device with one or more frequency selection devices.

The following description illustrates the operation of the RF synthesisers. In this description the frequencies cited are for illustration only; the invention is not restricted to these frequencies. The OFC has its reference input signal set to 1 GHz, the first frequency selecting and translating device, 3 has its RF frequency reference 4 set to a frequency in the range between 1 GHz and 2 GHz, in 1 MHz steps, and the second frequency translating device, 5 has its RF frequency reference 6 set to a frequency in the range between 1 GHz and 1.001 GHz, in 1 KHz steps. The lower end of the frequency spans chosen for $f_1$ and $f_2$ are set much higher than theoretically required so that 1/f noise problems are reduced and wide loop bandwidths can be used to achieve short locking times when OPLL/OIPLL are used as the frequency translation and selection devices.

This system is capable of providing an RF output that has a frequency range from 1 kHz up to the upper frequency limit of the photodetector in 1 kHz steps. Of course, by reducing the increment size of $f_2$, an arbitrarily small frequency increment, and minimum frequency, can be achieved.

The RF frequency references 2, 4, 6 each comprise of RF frequency synthesisers, and references 4 and 6 are capable of being varied in frequency over limited ranges mentioned above. All frequency references 2, 4, 6 are locked to a common reference that is not shown on the diagram.

Further frequency selecting and translating devices, along with their references 13 can be added to the system to produce more complex waveforms than the sinusoids envisaged above.

Figure 2A:
FIG. 2a–2e show illustrative spectra typically present at various nodes of the layout shown in FIG. 1.

FIG. 2a diagrammatically illustrates a typical comb line that might be seen at the output of the OCG. The whole spectrum is presented to the inputs of the frequency selection and translation devices 3, 5.

Figure 2B:
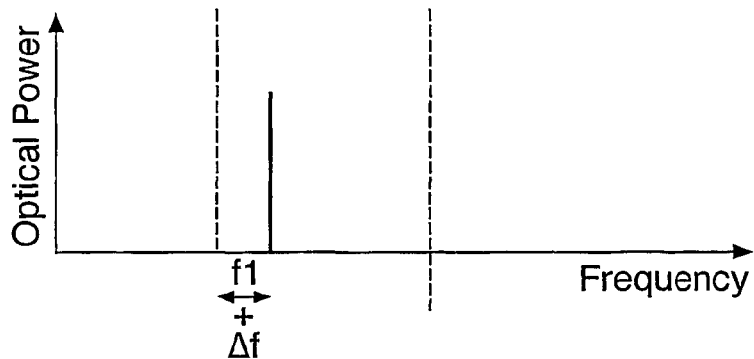

FIG. 2b illustrates how the selection and translation device 3 selects a particular component of the OCG spectrum and translates it by $f_1$.

Figure 2C:
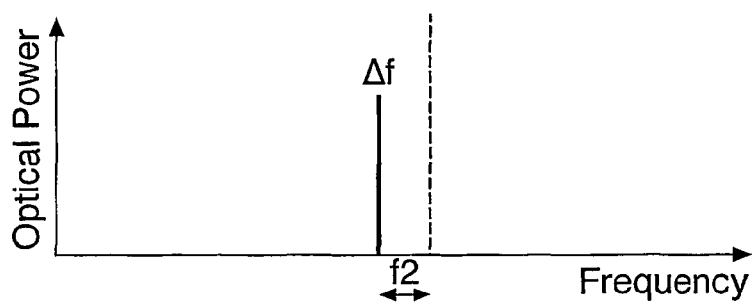

FIG. 2c illustrates how the selection and translation device 5 selects a second component of the OCG spectrum and translates it by $f_2$. The comb line selected by device 5 is separated from that which is selected by device 3 by 2 $f_c$.

Figure 2D:
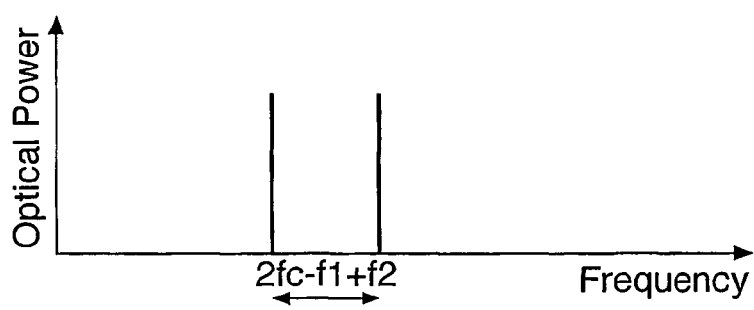

FIG. 2d shows that the optical spectrum presented to the optical detector as result of combing the output of frequency selection and translation devices 3 and 5 comprises two optical components separated by 2 $f_c-f_1+f_2$.

Figure 2E:
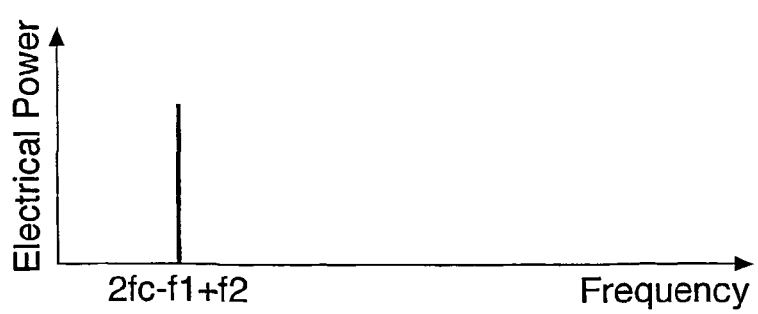

FIG. 2e shows that the RF spectrum following envelop detection comprises a single component at $2f_c-f_1+f_2$.

Figure 3:
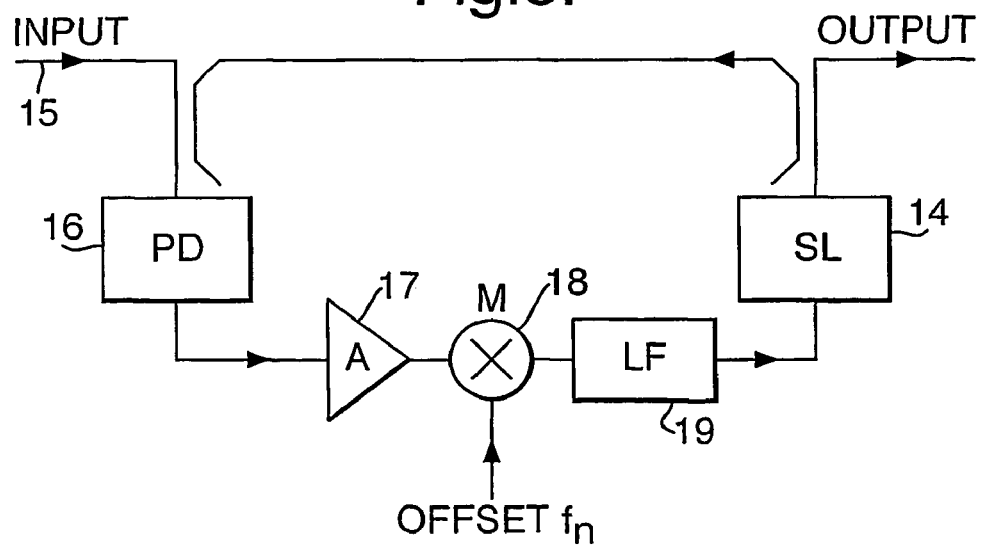
FIG. 3 shows in more detail the operation of one type of frequency selecting and translating device, the heterodyne optical phase locked loop.

FIG. 3 shows in more detail the operation of one type of frequency selecting and translating device, the OPLL.

The input from the OFC generator 1 is combined with a sample of the output from a tuneable slave laser 14, SL, such that their electric fields overlap, before detection in a photo-detector 16, PD. The output from the PD 16 is amplified in an amplifier 17, A and fed to the signal input of a mixer 18, M. The offset frequency, $f_n$, is applied to the local oscillator input of the mixer 18. The intermediate frequency output port of the mixer 18, which must have a frequency response extending to zero frequency, is connected to the input of a loop filter 19, LF. LF 19 is designed in accordance with well known phase-lock loop theory to have a passband substantially less than the minimum required offset frequency $f_n$. LF 19 may incorporate lock acquisition and detection circuits. The output from LF 19 is connected to the tuning control of SL 14. SL 14 can be a tuneable external cavity laser or preferably a monolithic tuneable laser. The output from SL 14 forms the output from the frequency selecting and translating mechanism. The control loop, comprising PD 16, A 17, M 18, LF 19, SL 14, locks when the heterodyne frequency at the output of PD 16 is exactly equal to the offset frequency $f_n$.

OPLLs are suitable for use where the time taken for the signal to propagate around the control loop is small relative to the reciprocal of the spectral linewidth of SL 14.

Figure 4:
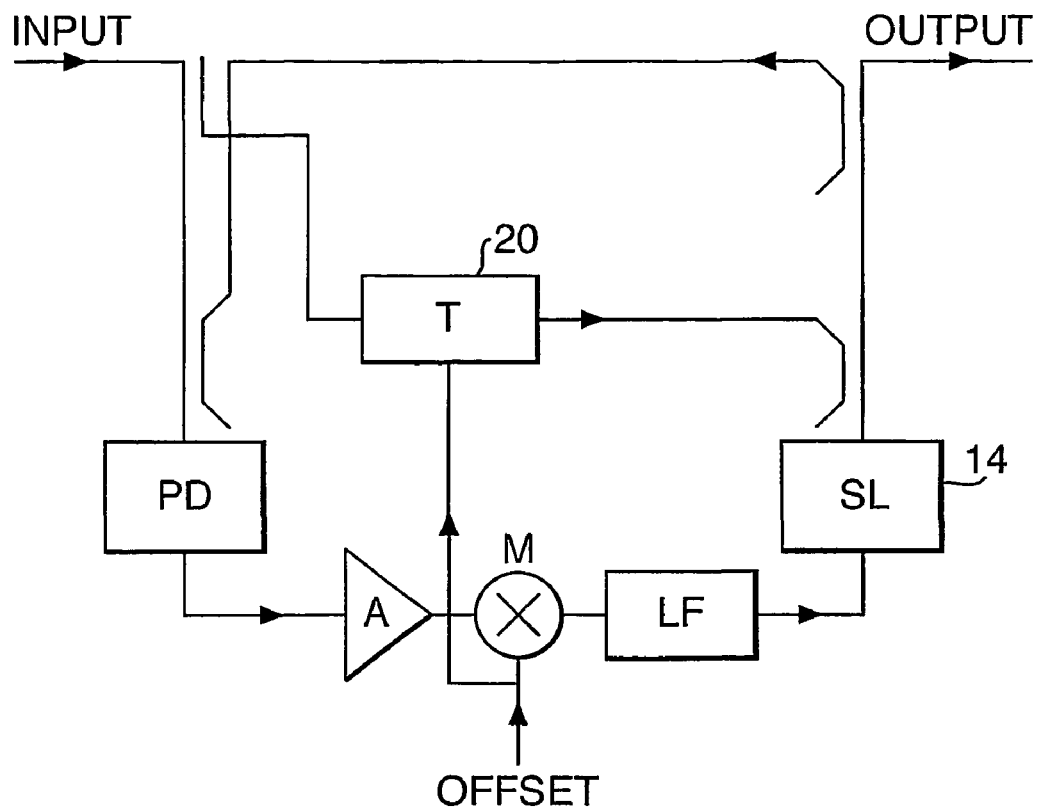
FIG. 4 shows in more detail the operation of another type of frequency selecting and translating device, the optical injection phase locked loop.

FIG. 4 shows in more detail the operation of another type of frequency selecting and translating device, the heterodyne OIPLL.

In this approach, a frequency translating device 20, T, which could be an optical intensity or phase modulator or an optical single sideband modulator using electro-optic, acousto-optic or other physical principles, is added into the OPLL circuit described above. It is used to translate the OFC generator's spectrum by the required offset. The output from T 20 is coupled to the slave laser 14 so as to injection-lock it to the required offset output frequency. This approach avoids the control loop delay restrictions of the OPLL and is therefore well suited for applications where SL 14 is a monolithic semiconductor laser. The phase lock loop path from PD through A, M and LF to SL can be designed with a narrow bandwidth to track the environmental disturbances on SL and so provide much wider locking ranges than could be obtained if only injection-locking were used. The path lengths between the offset source and T 20, and between the offset source and M are adjusted so that the injection locking and phase locking processes add constructively.

Figure 5:
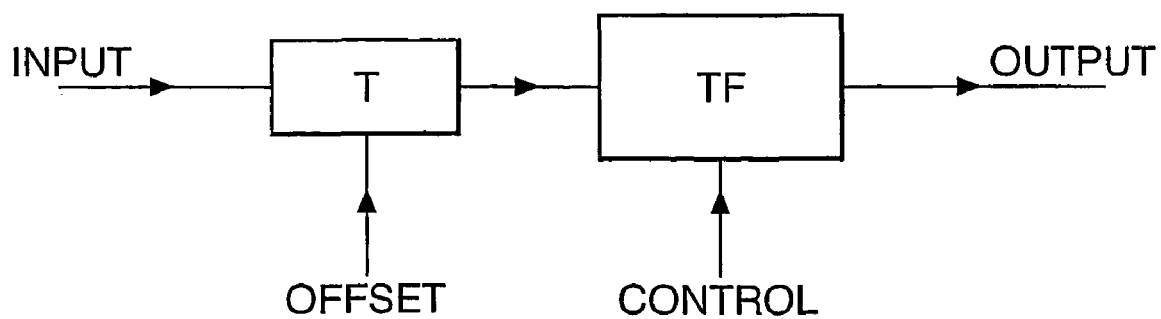
FIG. 5 shows in more detail the operation of another type of frequency selecting and translating device, the filtered optical modulator.

FIG. 5 shows in more detail the operation of another type of frequency selecting and translating device, the filtered acousto-optic or electro-optic translator.

In this approach, a frequency translating device, T, which could be an optical intensity or phase modulator or an optical single sideband modulator using electro-optic, acousto-optic or other physical principles, is used to translate the comb spectrum by the required offset. The output from T feeds a tuneable optical filter, TF, which is tuned by a control input to select the required offset comb line. If non single sideband translating devices are used this approach requires that the minimum offset frequency be large relative to the bandwidth of the tuneable optical filter. Although not shown on the diagram, it is advantageous to include a tuneable optical filter before the frequency translating device T to further reduce the unwanted spurii resulting from the mixing process.

Figure 6:
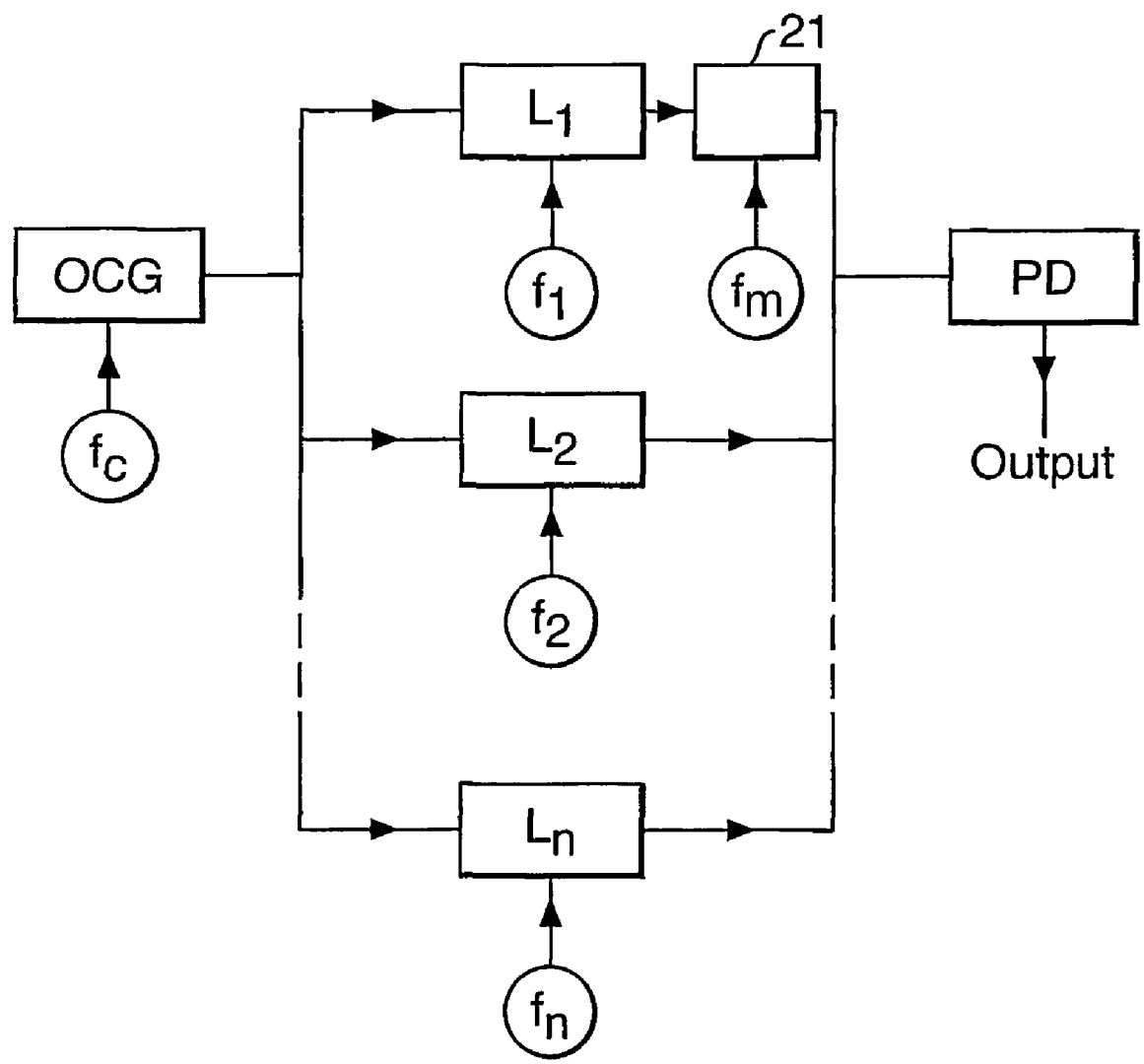
FIG. 6 shows the system also incorporating an optical modulator in one of the outputs from the translator.

FIG. 6 shows an optical modulator 21 in the optical path from one of the optical frequency translation and selection devices, which allows the system to generate modulated signals. Typically, the modulation signal $f_m$ would be a baseband signal, but may be an Intermediate Frequency (IF) signal that itself comprises a carrier that has been modulated with a baseband signal. Modulators could be positioned in the optical paths of a plurality of the selection and translation devices to increase the versatility of the final RF signal produced. Although the modulator is shown in FIG. 6 as being positioned before the signals are combined, it could also be positioned after the combiner, but would then only be able to add the same modulation signal to all optical signals The outputs of the frequency selection and translation devices 3, 5 are combined and applied to the photodetector. The photodetector should have a bandwidth greater than the maximum frequency to be generated. The combination process should be arranged so that the electric fields of the two optical outputs overlap, as discussed above.

Communications systems that incorporate the present invention will have particular benefits. Wide band communication are possible, and frequency changes can be made quickly. Also, signals having multiple outputs can be produced, each having an independent modulation signal. This may be particularly suitable for generating signals for multiple mobile receivers. The system will also have benefits if incorporated into radar systems, where it is often necessary to generate wideband modulated waveforms.

An important performance parameter for any frequency synthesiser, particularly when used in the above applications, is the level of spurious outputs. Conventional multi-octave synthesisers frequently produce strong (>-40 dB relative to wanted output) harmonic and sub harmonic spurious signals. For the present invention, the level of spurious signals is determined by the filtering effectiveness of the optical frequency selecting or optical frequency selecting and translating devices. Using injection locked SG-DBR lasers with a comb line spacing of 17.5 GHz a suppression of adjacent comb lines of >30 dB has been demonstrated[7], corresponding to a suppression of >60 dB in the detected RF output. Detailed modelling[8] has shown that for an injected power of -40 dB relative to injection locked DFB laser output power lines spaced by 10 GHz would be suppressed by >36 dB, corresponding to a suppression of >72 dB in the detected RF output. Reducing the line spacing to 1 GHz would reduce the suppression in the optical output to <16 dB due to gain modulation effects in the DFB laser, corresponding to a suppression of <32 dB in the detected RF output. For this reason and to relax injection locked DFB laser temperature and current control requirements comb line spacings >2 GHz are preferable.

REFERENCES

1 "Optical Techniques for Microwave Generation, Transmission and Control", L Goldberg et al, 229–232, 1990 IEEE MTT-S Digest
2 "High Frequency Source Having Heterodyned Laser Oscillators Injection-Locked to a Mode-Locked Laser", Granted patent, U.S. Pat. No. 5,379,309
3 "Optical frequency division using an optical parametric oscillator", D Lee and N C Wong, Optics Letters, Vol.15 pp. 1129–1131, 1990
4 "Efficient optical frequency-comb generator", A S Bell, G M McFarlane, E Riis, and I Ferguson, Optics Letters, Vol 20, No. 12, pp. 1435–1437, 1995.

5 "A multiwavelength source having precise channel spacing for WDM systems", J J Veselka and S K Korotky, IEEE Photonics Technology Letters, Vol 10, no. 7 1998.

6 "Optical Frequency comb generator using phase modulation in amplified circulating loop", K P HO and J M Kahn, IEEE Photonics Technology Letters, Vol. 5, No. 6, p. 721–725, 1993

7 "Exact optical frequency synthesis over >1THz using SG-DBR lasers", C. F. C. Silva, L. N. Langley and A. J. Seeds, CLEO Europe 2000, Nice, September 2000, p. 163.

8 "Microwave frequency synthesis using injection locked laser comb line selection", B. Cai, D. Wake and A. J. Seeds, IEEE/LEOS Summer Topical Meeting on RF Opto-electronics, Keystone, USA, August 1995, published in the 1995 Digest of the LEOS Summer Topical Meetings, pp. 13–14.

What is claimed is:

1. A frequency synthesiser comprising at least one optical frequency selection and translation device used to provide a first optical output and taking an output from an optical reference oscillator system capable of providing at least two different optical frequency outputs, where the first output from the selection and translation device is arranged to be combined with a second optical output signal derived from the optical reference oscillator system and downconverted to produce a radio frequency signal.

2. A frequency synthesiser as claimed in claim 1 whereby the second optical output signal is derived from an optical frequency selection and translation device that takes an input from the optical reference oscillator system.

3. A frequency synthesiser as claimed in claim 2 whereby the optical reference oscillator system and all radio frequency references are linked to a common frequency reference signal.

4. A frequency synthesiser as claimed in claim 1 whereby a radio frequency reference frequency input to each frequency selection and translating device is used to derive a frequency difference between the input from the optical reference oscillator system and the output from the frequency selection and translating device.

5. A frequency synthesiser as claimed in claim 3 where the reference frequency of each frequency selection and translating device is different.

6. A frequency synthesiser as claimed in claim 1 whereby the frequency selection and translating device is a heterodyne phase locked loop.

7. A frequency synthesiser as claimed in claim 1 whereby the frequency selection and translating device is a heterodyne optical injection phase locked loop.

8. A frequency synthesiser as claimed in claim 1 whereby the frequency selection and translating device is an acousto-optical frequency shifter.

9. A frequency synthesiser as claimed in claim 1 whereby the frequency selection and translating device is an electro-optical frequency shifter.

10. A frequency synthesiser as claimed in claim 1 whereby the frequency selection and translating device is an optical injection phase locked loop.

11. A frequency synthesiser as claimed in claim 1 whereby the frequency selection and translating device is fed with a baseband modulation signal.

12. A frequency synthesiser as claimed in claim 1 whereby the optical output from the frequency selection and translating device is fed into an optical modulator.

13. A frequency synthesiser as claimed in claim 1 where the source optical reference oscillator system is an optical frequency comb generator.

14. A frequency synthesiser as claimed in claim 13 whereby the frequency spacing between adjacent outputs of the optical frequency comb generator is dependent on the frequency of a reference signal input to the optical frequency comb generator.

15. A frequency synthesiser as claimed in claim 14 where the optical frequency comb generator is an Optical Parametric Oscillator Frequency Divider.

16. A frequency synthesiser as claimed in claim 14 where the optical frequency comb generator is an External Resonant Cavity Electro-Optic optical frequency comb generator.

17. A frequency synthesiser as claimed in claim 14 where the optical frequency comb generator employs a fibre ring structure.

18. A frequency synthesiser as claimed in claim 14 where the optical frequency comb generator employs a mode locked laser.

19. A frequency synthesiser as claimed in claim 1 where the combined output is detected using a photodetector.

20. A communications system incorporating a frequency synthesiser as claimed in claim 1.

21. A radar system incorporating a frequency synthesiser as claimed in claim 1.

22. A method of synthesising a signal comprising the steps of:

providing a reference system having an output that has a plurality of spectral lines within the frequency band used by a laser;

presenting this output to a frequency selection and translation device having an output that comprises a single spectral line chosen from those at its input that has been translated in the frequency domain by an amount determined by a reference frequency input.

presenting the output of the reference system to a frequency selection device that is capable of selecting a single spectral line;

taking the output from the frequency selection and translation device, and the output from the frequency selection device, and combining and downconverting the two outputs to produce a radio frequency signal.

23. A method as claimed in claim 22 wherein the frequency selection device is also capable of frequency translation.

* * * * *

UNITED STATES PATENT AND TRADEMARK OFFICE
CERTIFICATE OF CORRECTION

PATENT NO.         : 6,980,353 B2                                              Page 1 of 1
APPLICATION NO. : 10/399654
DATED                 : December 27, 2005
INVENTOR(S)        : Christopher D. Watson and Alwyn J. Seeds It is certified that error appears in the above-identified patent and that said Letters Patent is hereby corrected as shown below:

Column 10, claim 22 to read as follows:

22. A method of synthesising a signal comprising the steps of:
    providing a reference system having an output that has a plurality of spectral lines within the frequency band used by a laser;
    presenting this output to a frequency selection and translation device having an output that comprises a single spectral line chosen from those at its input that has been translated in the frequency domain by an amount determined by a reference frequency input;
    presenting the output of the reference system to a frequency selection device that is capable of selecting a single spectral line; and
    taking the output from the frequency selection and translation device, and the output from the frequency selection device, and combining and downconverting the two outputs to produce a radio frequency signal.

Signed and Sealed this

Twenty-ninth Day of July, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,980,353 B2 | Page 1 of 1 |
| APPLICATION NO. | : 10/399654 | |
| DATED | : December 27, 2005 | |
| INVENTOR(S) | : Christopher D. Watson and Alwyn J. Seeds | |

It is certified that error appears in the above-identified patent and that said Letters Patent is hereby corrected as shown below:

Column 10, claim 22, lines 37-54 to read as follows:

22. A method of synthesising a signal comprising the steps of:
providing a reference system having an output that has a plurality of spectral lines within the frequency band used by a laser;
presenting this output to a frequency selection and translation device having an output that comprises a single spectral line chosen from those at its input that has been translated in the frequency domain by an amount determined by a reference frequency input;
presenting the output of the reference system to a frequency selection device that is capable of selecting a single spectral line; and
taking the output from the frequency selection and translation device, and the output from the frequency selection device, and combining and downconverting the two outputs to produce a radio frequency signal.

This certificate supersedes the Certificate of Correction issued July 29, 2008.

Signed and Sealed this

Twenty-sixth Day of August, 2008

JON W. DUDAS
*Director of the United States Patent and Trademark Office*